United States Patent
Mataki

(10) Patent No.: US 9,176,376 B2
(45) Date of Patent: Nov. 3, 2015

(54) PATTERN TRANSFER METHOD AND APPARATUS

(75) Inventor: Hiroshi Mataki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 548 days.

(21) Appl. No.: 13/582,083

(22) PCT Filed: Mar. 2, 2011

(86) PCT No.: PCT/JP2011/055429
§ 371 (c)(1),
(2), (4) Date: Aug. 31, 2012

(87) PCT Pub. No.: WO2011/108750
PCT Pub. Date: Sep. 9, 2011

(65) Prior Publication Data
US 2013/0004669 A1   Jan. 3, 2013

(30) Foreign Application Priority Data

Mar. 3, 2010   (JP) .................................. 2010-046804

(51) Int. Cl.
| | |
|---|---|
| B05D 5/00 | (2006.01) |
| G03F 7/00 | (2006.01) |
| B82Y 10/00 | (2011.01) |
| B82Y 40/00 | (2011.01) |

(52) U.S. Cl.
CPC ............... *G03F 7/0002* (2013.01); *B82Y 10/00* (2013.01); *B82Y 40/00* (2013.01)

(58) Field of Classification Search
CPC .............................. B82Y 40/00; G03F 7/0002
USPC ....................................................... 427/256
See application file for complete search history.

(56) References Cited

U.S. PATENT DOCUMENTS

| | | | |
|---|---|---|---|
| 7,662,432 B2 * | 2/2010 | Suzuki ........................... | 427/162 |
| 2004/0192041 A1* | 9/2004 | Jeong et al. .................... | 438/689 |
| 2004/0228964 A1* | 11/2004 | Ito et al. .......................... | 427/64 |
| 2005/0089635 A1* | 4/2005 | Hasei ............................. | 427/256 |
| 2005/0160011 A1* | 7/2005 | Sreenivasan et al. ............ | 705/26 |

(Continued)

FOREIGN PATENT DOCUMENTS

| | | |
|---|---|---|
| JP | 2007-173806 A | 7/2007 |
| JP | 2008-42187 A | 2/2008 |

(Continued)

OTHER PUBLICATIONS

International Search Report issued in PCT/JP2011/055429 mailed Jun. 7, 2011.

(Continued)

*Primary Examiner* — Cachet Sellman
(74) *Attorney, Agent, or Firm* — Birch, Stewart, Kolasch & Birch, LLP

(57) ABSTRACT

A method of performing pattern transfer includes the steps of: applying liquid to a substrate, while performing relative movement of the substrate and a liquid ejection head having a plurality of nozzles, by performing ejection and deposition of a plurality of droplets of the liquid from the nozzles onto the substrate in a state where a shape of each of the droplets upon the deposition is not a single circular shape and each of the droplets does not combine with adjacent another of the droplets on the substrate; and curing the liquid that has been applied to the substrate in the applying step while pressing a pattern forming surface of a stamper having a prescribed projection-recess pattern against the liquid.

20 Claims, 11 Drawing Sheets

(56) References Cited

U.S. PATENT DOCUMENTS

| | | |
|---|---|---|
| 2007/0138699 A1 | 6/2007 | Wuister et al. |
| 2008/0018875 A1 | 1/2008 | Schram et al. |
| 2008/0223237 A1* | 9/2008 | Ando et al. .................. 101/333 |
| 2009/0085255 A1 | 4/2009 | Tada et al. |

FOREIGN PATENT DOCUMENTS

| | | |
|---|---|---|
| JP | 2009-83172 A | 4/2009 |
| JP | 2011-49302 A | 3/2011 |
| JP | 2011-71500 A | 4/2011 |
| WO | WO 2005/047975 A2 | 5/2005 |
| WO | WO 2005/120834 A2 | 12/2005 |

OTHER PUBLICATIONS

Written Opinion of the International Searching Authority issued in PCT/JP2011/055429 mailed Jun. 7, 2011.

* cited by examiner

SUBSTRATE CONVEYANCE DIRECTION
(SUB-SCANNING DIRECTION)

PATTERN TRANSFER METHOD AND APPARATUS

TECHNICAL FIELD

The present invention relates to a pattern transfer method and a pattern transfer apparatus, and more particularly to a pattern transfer method and a pattern transfer apparatus for transferring a pattern by curing a liquid that has been applied on a substrate in a state where a stamper formed with a desired projection-recess pattern is pressed against the liquid.

BACKGROUND ART

With the development of increasingly fine and higher levels of integration in semiconductor integrated circuits in recent years, a so-called nano-imprinting method is known as technology for forming a fine structure on a substrate, in which a fine pattern is transferred by applying a resist (e.g., UV-curable resin) onto a substrate, curing the resist by irradiation of UV light in a state where a stamper formed with a desired projection-recess pattern to be transferred is pressed against the resist, and separating the stamper from the resist on the substrate.

In the nano-imprinting method described in PTL 1, inkjet technology is used for applying a resist onto a substrate. In this technology, when ejecting droplets of liquid or resist solution from the nozzles of an inkjet head to dispose the droplets on a substrate, the distance between the droplets and the volume of the droplets are adjusted in accordance with the pattern shape of the stamper, in such a manner that a resin layer is formed to a uniform thin thickness (residual film) after imprinting or pattern transfer.

CITATION LIST

Patent Literature

PTL 1: WO 2005/120834

SUMMARY OF INVENTION

Technical Problem

The technology described in PTL 1 makes no mention of the shape of the droplets after landing on the substrate. Depending on the shape of the droplets after landing, there is a possibility of liquid movement occurring due to combination of the droplets on the substrate, and there is a problem in that this leads to film thickness non-uniformities occurring in the resist layer after imprinting. On the other hand, if there is insufficient wetting and spreading of the droplets immediately after landing, then it takes time for the recess sections of the stamper to be filled in by the liquid, and hence there is a problem in that this leads to increased imprinting time.

Solution to Problem

The present invention has been contrived in view of these circumstances, an object thereof being to provide a pattern transfer method and a pattern transfer apparatus whereby it is possible to prevent film thickness non-uniformities occurring during imprinting while shortening the imprinting time.

In order to attain the aforementioned object, the present invention is directed to a method of performing pattern transfer, comprising the steps of: applying liquid to a substrate, while performing relative movement of the substrate and a liquid ejection head having a plurality of nozzles, by performing ejection and deposition of a plurality of droplets of the liquid from the nozzles onto the substrate in a state where a shape of each of the droplets upon the deposition is not a single circular shape and each of the droplets does not combine with adjacent another of the droplets on the substrate; and curing the liquid that has been applied to the substrate in the applying step while pressing a pattern forming surface of a stamper having a prescribed projection-recess pattern against the liquid.

According to this aspect of the present invention, by ensuring that the droplet shape immediately after landing is not a single circular shape (for example, to be an elliptical shape, or the like), it is possible to shorten the wetting and spreading time of the droplets which have landed on the substrate, compared to a case where the droplet shape is a single circular shape, and furthermore, since there is no movement of the liquid due to combination of the droplets on the substrate, then there is no occurrence of bias in the liquid distribution on the substrate. As a result of this, it is possible to prevent non-uniformity in the thickness of the film produced by imprinting, while shortening the imprinting time.

Preferably, each of the droplets upon the ejection from the nozzles has a substantially columnar shape and satisfies:

[Math. 1]

$$l\frac{U_k}{U_d} > 2\sqrt[3]{\frac{3V(1+\cos\theta)\sin\theta}{\pi(1-\cos\theta)(2+\cos\theta)}}, \quad (1)$$

where V is a volume of each of the droplets, l is a length of the substantially columnar shape of each of the droplets, $U_d$ is a speed of each of the droplets upon the ejection, $U_k$ is a speed of the relative movement of the substrate and the liquid ejection head, and θ is an angle of contact between each of the droplets and the substrate.

Preferably, the droplets upon the deposition on the substrate satisfy:

[Math. 2]

$$l\frac{U_k}{U_d} < p_x, \quad (2)$$

where $p_x$ is a pitch of the droplets upon the deposition on the substrate in a direction in which the relative movement of the substrate and the liquid ejection head is performed.

Preferably, the droplets upon the deposition on the substrate satisfy:

[Math. 3]

$$\frac{4U_d}{lU_k}\left\{\frac{3V(1+\cos\theta)\sin\theta}{\pi(1-\cos\theta)(2+\cos\theta)}\right\}^{\frac{2}{3}} < p_y, \quad (3)$$

where $p_y$ is a pitch of the droplets upon the deposition on the substrate in a direction perpendicular to a direction in which the relative movement of the substrate and the liquid ejection head is performed.

Preferably, while the ejection is performed, at least first and second droplets of the liquid are successively ejected from each of the nozzles by each of ejection operations and satisfy:

[Math. 4]

$$2l\frac{U_k}{U_s} > 2\sqrt[3]{\frac{3V(1+\cos\theta)\sin\theta}{\pi(1-\cos\theta)(2+\cos\theta)}}, \quad (4)$$

where V is a total volume of the first and second droplets, l is a distance between the first and second droplets upon the deposition on the substrate, $U_s$ is a speed the second droplet upon the ejection, $U_k$ is a speed of the relative movement of the substrate and the liquid ejection head, and θ is an angle of contact between each of the first and second droplets and the substrate.

Preferably, the first droplet ejected by a first one of the ejection operations and the first droplet ejected by a second one of the ejection operations successive to the first one of the ejection operations, upon the deposition on the substrate satisfy:

[Math. 5]

$$2l\frac{U_k}{U_s} < p_x, \quad (5)$$

where $p_x$ is a pitch of the first droplets upon the deposition on the substrate in a direction in which the relative movement of the substrate and the liquid ejection head is performed.

Preferably, the first droplet ejected by a first one of the ejection operations and the first droplet ejected by a second one of the ejection operations successive to the first one of the ejection operations, upon the deposition on the substrate satisfy:

[Math. 6]

$$\frac{2U_s}{lU_k}\left\{\frac{3V(1+\cos\theta)\sin\theta}{\pi(1-\cos\theta)(2+\cos\theta)}\right\}^{\frac{2}{3}} < p_y; \text{ and} \quad (6)$$

[Math. 7]

$$2\sqrt[3]{\frac{3V_l(1+\cos\theta)\sin\theta}{\pi(1-\cos\theta)(2+\cos\theta)}} < p_y, \quad (7)$$

where $p_y$ is a pitch of the first droplets upon the deposition on the substrate in a direction perpendicular to a direction in which the relative movement of the substrate and the liquid ejection head is performed, and $V_l$ is a volume of a larger of the first and second droplets.

Preferably, in the curing step, the pattern forming surface of the stamper is pressed against the liquid from one end portion of the pattern forming surface toward another end portion of the pattern forming surface in a first direction that is different from a second direction in which the droplets ejected from a same one of the nozzles are aligned on the substrate.

Preferably, the first direction is perpendicular to the second direction.

In order to attain the aforementioned object, the present invention is also directed to a pattern transfer apparatus, comprising: a liquid ejection head which has a plurality of nozzles and performs ejection and deposition of a plurality of droplets of liquid from the nozzles onto a substrate; a conveyance device which causes relative movement of the substrate and the liquid ejection head; a control device which ensures that a shape of each of the droplets upon the deposition on the substrate is not a single circular shape and each of the droplets does not combine with adjacent another of the droplets on the substrate; and a curing device which cures the liquid that has been applied to the substrate by the deposition of the droplets while pressing a pattern forming surface of a stamper having a prescribed projection-recess pattern against the liquid.

According to this aspect of the present invention, by ensuring that the droplet shape immediately after landing is not a single circular shape (for example, to be an elliptical shape, or the like), it is possible to shorten the wetting and spreading time of the droplets which have landed on the substrate, compared to a case where the droplet shape is a single circular shape, and furthermore, since there is no movement of the liquid due to combination of the droplets on the substrate, then there is no occurrence of bias in the liquid distribution on the substrate. As a result of this, it is possible to prevent non-uniformity in the thickness of the film produced by imprinting, while shortening the imprinting time.

Preferably, each of the droplets upon the ejection from the nozzles has a substantially columnar shape and satisfies:

[Math. 8]

$$l\frac{U_k}{U_d} > 2\sqrt[3]{\frac{3V(1+\cos\theta)\sin\theta}{\pi(1-\cos\theta)(2+\cos\theta)}}, \quad (8)$$

where V is a volume of each of the droplets, l is a length of the substantially columnar shape of each of the droplets, $U_d$ is a speed of each of the droplets upon the ejection, $U_k$ is a speed of the relative movement of the substrate and the liquid ejection head, and θ is an angle of contact between each of the droplets and the substrate.

Preferably, while the liquid ejection head performs the ejection, at least first and second droplets of the liquid are successively ejected from each of the nozzles by each of ejection operations and satisfy:

[Math. 9]

$$2l\frac{U_k}{U_s} > 2\sqrt[3]{\frac{3V(1+\cos\theta)\sin\theta}{\pi(1-\cos\theta)(2+\cos\theta)}}, \quad (9)$$

where V is a total volume of the first and second droplets, l is a distance between the first and second droplets upon the deposition on the substrate, $U_s$ is a speed the second droplet upon the ejection, $U_k$ is a speed of the relative movement of the substrate and the liquid ejection head, and θ is an angle of contact between each of the first and second droplets and the substrate.

Preferably, the curing device presses the pattern forming surface of the stamper against the liquid from one end portion of the pattern forming surface toward another end portion of the pattern forming surface in a first direction that is different from a second direction in which the droplets ejected from a same one of the nozzles are aligned on the substrate.

Preferably, the first direction is perpendicular to the second direction.

Advantageous Effects of Invention

According to the present invention, by ensuring that the droplet shape immediately after landing is not a single circular shape (for example, an elliptical shape, or the like), it is possible to shorten the wetting and spreading time of the droplets which have landed on the substrate, compared to a case where the droplet shape is a single circular shape, and furthermore, since there is no movement of liquid due to combination of droplets on the substrate, then there is no occurrence of bias in the liquid distribution on the substrate. As a result of this, it is possible to prevent non-uniformity in the thickness of the film produced by imprinting, while shortening the imprinting time.

DESCRIPTION OF EMBODIMENTS

First Embodiment

Figure 1:
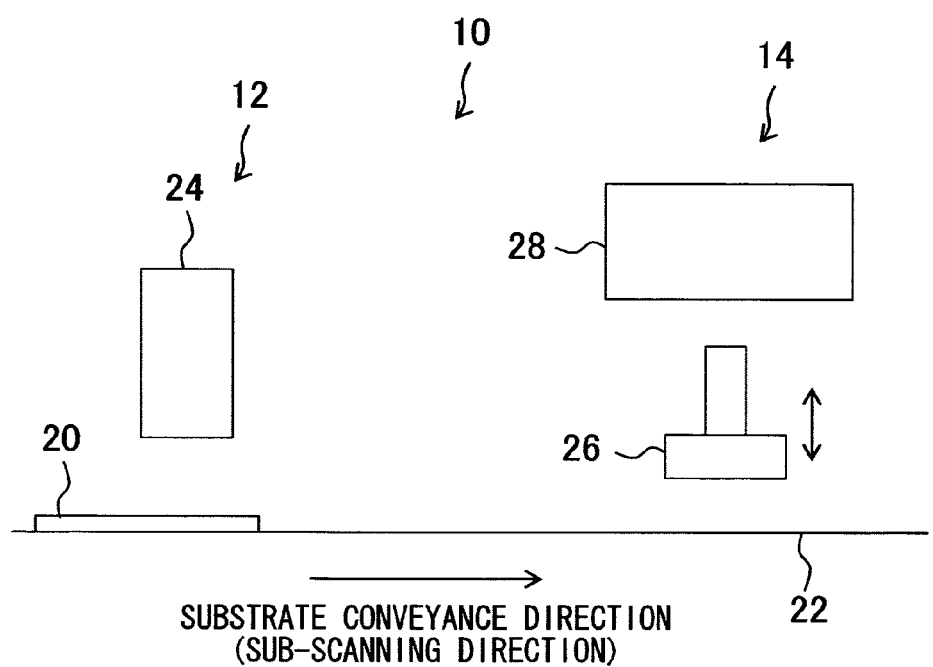
FIG. 1 is a general schematic drawing of a pattern transfer apparatus according to a first embodiment of the present invention.

FIG. 1 is a general schematic drawing of a pattern transfer apparatus according to the first embodiment of the present invention. The pattern transfer apparatus 10 shown in FIG. 1 includes: a resist application unit 12, which applies resist (e.g., UV-curable resin) onto the substrate 20; a pattern transfer unit 14, which transfers a desired pattern to the resist that has been applied to the substrate 20; and a conveyance unit 22, which conveys the substrate 20.

The conveyance unit 22 includes a conveyance device, such as a belt, for example, and conveys the substrate 20 in a direction from the resist application unit 12 toward the pattern transfer unit 14 (hereinafter referred to as a "substrate conveyance direction" or a "sub-scanning direction") while holding the substrate 20 on the surface of the conveyance device. Instead of moving the substrate 20, it is also possible to move the resist application unit 12 and the pattern transfer unit 14 with respect to a stationary substrate.

The resist application unit 12 includes a recording head (inkjet head) 24, in which a plurality of nozzles 51 (not shown in FIG. 1, and shown in FIGS. 2A to 2C) are formed, and applies resist onto a surface of the substrate 20 (resist application surface) by ejecting droplets of liquid (resist solution) from the nozzles 51.

The recording head 24 is constituted of a long full-line head, in which the nozzles 51 are arranged throughout a maximum recording width in a direction (hereinafter referred to as a "substrate widthwise direction" or a "main scanning direction") perpendicular to the substrate conveyance direction. It is possible to arrange the droplets at desired positions on the substrate 20 by performing just one operation of moving the substrate 20 and the recording head 24 relatively in the substrate conveyance direction (sub-scanning direction), without moving the recording head 24 in the substrate widthwise direction (main scanning direction), and therefore it is possible to raise the resist application rate.

The pattern transfer unit 14 includes: a stamper (die) 26, in which a desired projection-recess pattern to be transferred to the resist on the substrate 20 is formed; and a UV irradiation device 28, which irradiates UV light. The pattern transfer unit 14 transfers the pattern to the resist on the substrate 20 by irradiating UV light from the UV irradiation device 28 to cure the resist on the substrate 20 in a state where the stamper 26 is pressed against the surface of the substrate 20 to which the resist has been applied.

The stamper 26 is formed with a light-transmitting material that is capable of transmitting UV light irradiated by the UV irradiation device 28. It is possible to use glass, quartz, sapphire, transparent plastic (e.g., acrylic resin, hard vinyl chloride, or the like) as the light-transmitting material. By this means, when UV light is irradiated from the UV irradiation device 28 located above the stamper 26 (on the opposite side from the substrate 20), UV light is irradiated onto the resist on the substrate 20 without being shielded by the stamper 26 and the resist can therefore be cured.

The stamper 26 is arranged movably in the vertical direction in FIG. 1. The stamper 26 is moved downward while maintaining a state where the pattern forming surface of the stamper 26 is substantially parallel with the surface of the substrate 20, and is made in contact with the whole surface of the substrate 20 virtually simultaneously, thereby performing pattern transfer.

Figure 2A:
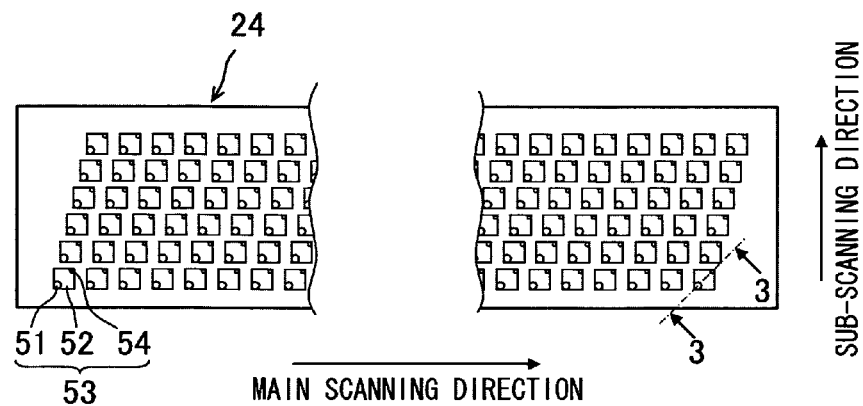
FIG. 2A is a plan view perspective diagram showing an embodiment of the structure of a head in the pattern transfer apparatus.
Figure 2B:
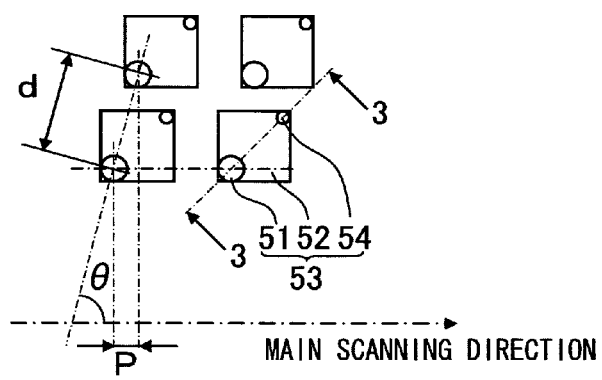
FIG. 2B is a partial enlarged view of FIG. 2A.
Figure 2C:
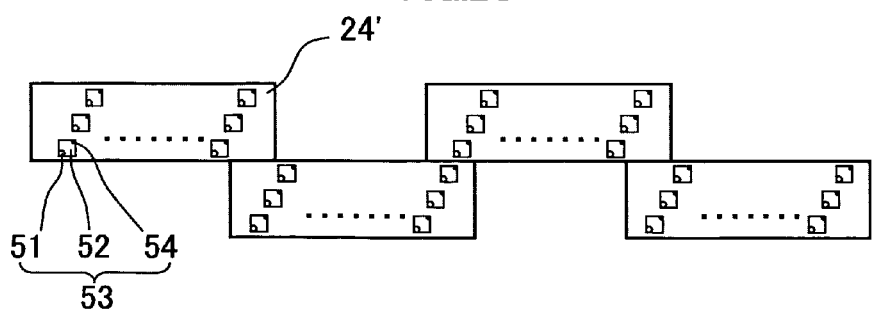
FIG. 2C is a plan view perspective diagram showing another embodiment of the structure of a head in the pattern transfer apparatus.
Figure 3:
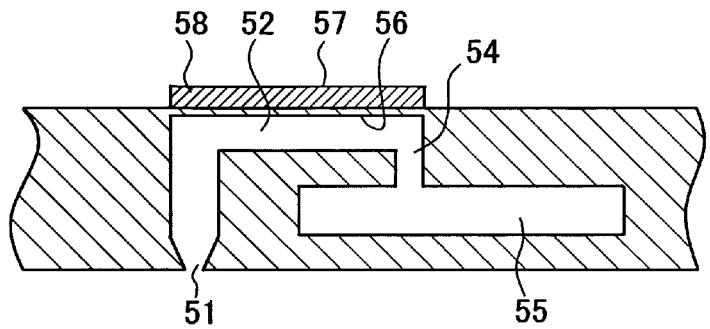
FIG. 3 is a cross-sectional diagram showing an inner structure of a droplet ejection element.

The structure of the recording head 24 is described in detail below. FIG. 2A is a plan view perspective diagram showing an embodiment of the structure of the recording head 24, and FIG. 2B is a partial enlarged view of FIG. 2A. FIG. 2C is a plan view perspective diagram showing another embodiment of the structure of the recording head 24. FIG. 3 is a cross-sectional diagram showing an inner structure of a droplet ejection element (a cross-sectional diagram along line 3-3 in FIGS. 2A and 2B).

The nozzle pitch in the recording head 24 should be reduce in order to reduce the interval between the droplets deposited on the substrate 20. As shown in FIGS. 2A and 2B, the recording head 24 in the present embodiment has a structure in which a plurality of droplet ejection elements 53, each including a droplet ejection port or the nozzle 51, a pressure chamber 52 corresponding to the nozzle 51, and the like, are disposed two-dimensionally in the form of a staggered matrix, and hence the effective nozzle interval (the projected nozzle pitch) as projected in the lengthwise direction of the head (the main scanning direction perpendicular to the substrate conveyance direction) is reduced and high nozzle density is achieved.

The mode of constituting one or more nozzle rows covering the length corresponding to the full width of the substrate 20 in the main scanning direction (substrate widthwise direction) is not limited to the present embodiment. For example, instead of the composition in FIG. 2A, as shown in FIG. 2C, a line head having nozzle rows of the length corresponding to the entire width of the substrate 20 can be formed by arranging and combining, in a staggered matrix, short head modules (head chips) 24', each of which has a plurality of nozzles 51 arrayed two-dimensionally. Furthermore, although not shown in the drawings, it is also possible to form a line head by aligning short heads in a row.

The planar shape of the pressure chamber 52 arranged for each nozzle 51 is substantially a square, and the nozzle 51 and the supply port 54 are disposed in both corners on a diagonal line of the square. Each pressure chamber 52 is communicated with a common flow channel 55 through the supply port 54.

Piezoelectric elements 58 each having individual electrodes 57 are bonded to a diaphragm 56, which constitutes a ceiling face of the pressure chambers 52 and also serves as a common electrode for the piezoelectric elements 58. The piezoelectric element 58 is deformed by applying a drive voltage to the individual electrode 57, thereby applying pressure to the liquid in the pressure chamber 52, and a droplet of the liquid is ejected from the nozzle 51 that is connected to the pressure chamber 52. When the droplet of the liquid is ejected, new liquid is supplied to the pressure chamber 52 from the common flow channel 55 through the supply port 54.

In the present embodiment, the piezoelectric elements 58 are employed as ejection pressure generating devices for the liquid ejected from the nozzles 51 arranged in the recording head 24; however, it is also possible to employ a thermal method in which heaters are arranged inside the pressure chambers 52, and the liquid is ejected by using the pressure of film boiling produced by heating by the heaters.

As shown in FIG. 2B, the high-density nozzle head according to the present embodiment is achieved by arranging the droplet ejection elements 53 having the above-described structure in a lattice fashion based on a fixed arrangement pattern, in a row direction which coincides with the main scanning direction, and a column direction which is inclined at a fixed angle of $\theta$ with respect to the main scanning direction, rather than being perpendicular to the main scanning direction.

More specifically, by adopting a structure in which the droplet ejection elements 53 are arranged at a uniform pitch d in line with the direction forming the angle of $\theta$ with respect to the main scanning direction, a pitch P of the nozzles projected so as to align in the main scanning direction is $d \times \cos \theta$, and hence the nozzles 51 can be regarded to be equivalent to those arranged linearly at the fixed pitch P along the main scanning direction. Such configuration results in a nozzle structure in which the nozzle row projected in the main scanning direction has a high nozzle density of up to 2,400 nozzles per inch.

When implementing the present invention, the arrangement structure of the nozzles is not limited to the embodiments shown in the drawings, and it is also possible to apply various other types of nozzle arrangements, such as an arrangement structure having one nozzle row in the sub-scanning direction.

Furthermore, the range of application of the present invention is not limited to a recording method based on a line head, and it is also possible to use a serial method, which performs recording over the whole surface of the recording area of the substrate 20 by repeating an operation of recording in the main scanning direction (substrate widthwise direction) by moving a short head that is shorter than the width of the substrate 20 in the main scanning direction, to scan the substrate 20 in the main scanning direction, then moving the short head by a prescribed amount in the sub-scanning direction (substrate conveyance direction) perpendicular to the main scanning direction after finishing one recording action in the main scanning direction, and then performing another recording action in the main scanning direction of the recording region.

Figure 4:
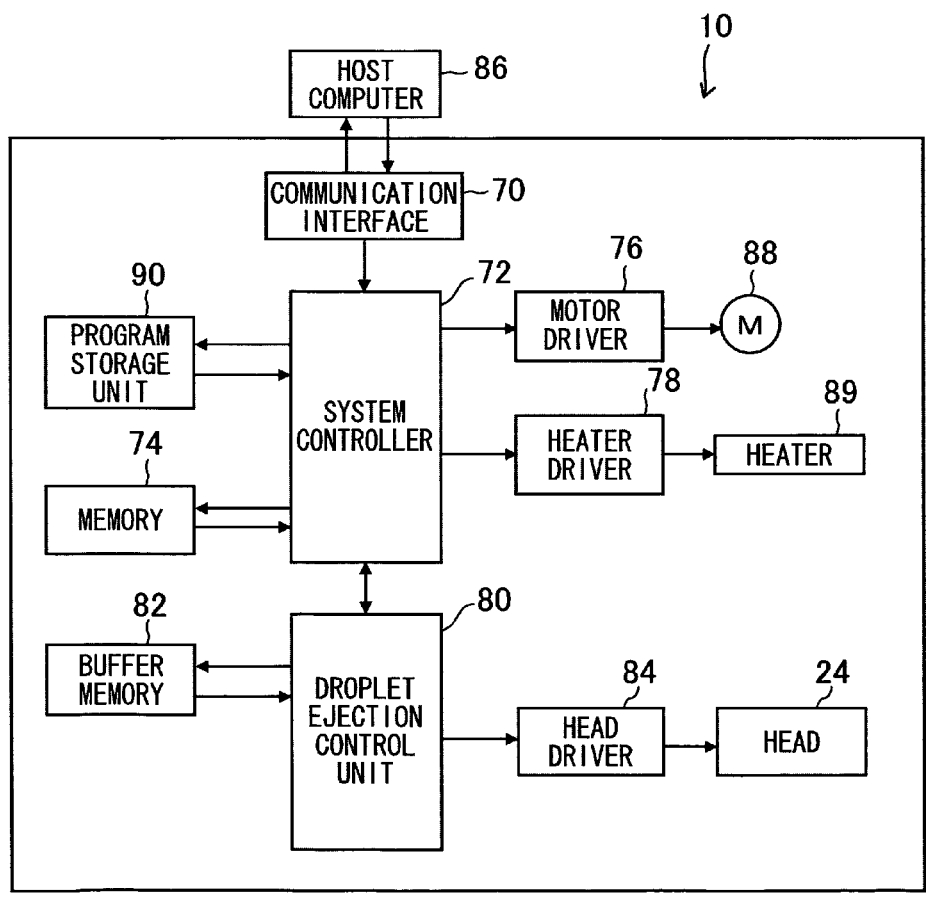
FIG. 4 is a principal block diagram showing the control system of the pattern transfer apparatus.

FIG. 4 is a block diagram showing the control system of the pattern transfer apparatus 10. The pattern transfer apparatus 10 includes a communication interface 70, a system controller 72, a memory 74, a motor driver 76, a heater driver 78, a droplet ejection control unit 80, a buffer memory 82, a head driver 84, and the like.

The communication interface 70 is an interface unit for receiving droplet ejection data sent from a host computer 86. A serial interface such as USB (Universal Serial Bus), IEEE1394, Ethernet, wireless network, or a parallel interface such as a Centronics interface can be used as the communication interface 70. A buffer memory (not shown) can be mounted in the communication interface 70 in order to increase the communication speed.

The system controller 72 is a control unit which controls the respective units of the communication interface 70, the memory 74, the motor driver 76, the heater driver 78, and the like. The system controller 72 is constituted of a central processing unit (CPU) and peripheral circuits, and the like, and controls communications with the host computer 86, and reading and writing of data from and to the memory 74, as well as generating control signals to control motors 88 and heaters 89 of the conveyance system.

The memory 74 is a storage device which includes a temporary storage area for data and a work area for the system controller 72 to carry out calculations. The droplet ejection data input through the communication interface 70 is read into the pattern transfer apparatus 10 and stored temporarily in the memory 74. Apart from a memory constituted of semiconductor devices, it is also possible to use a magnetic medium, such as a hard disk, for the memory 74.

A control program for the pattern transfer apparatus 10 is stored in the program storage unit 90. The system controller 72 reads out various control programs stored in the program storage unit 90, as appropriate, and executes the read control programs. The program storage unit 90 can employ a semiconductor memory, such as a ROM or EEPROM, or may use a magnetic disk, or the like. The program storage unit 90 can be provided with an external interface to use a memory card or a PC card. Of course, it is also possible to arrange a plurality of recording media, of these recording media.

The motor driver 76 is a drive circuit which drives the motors 88 in accordance with instructions from the system controller 72. The motors 50 include a motor for driving the conveyance unit 22 in FIG. 1.

The heater driver 78 is a drive circuit which drives the heaters 89 in accordance with instructions from the system controller 72. The heaters 89 include temperature adjustment heaters arranged in the respective sections of the pattern transfer apparatus 10.

The droplet ejection control unit 80 has a signal processing function for performing processing such as correction processing, and various types of processing for generating ejection control signals from the droplet ejection data stored in the memory 74 in accordance with commands from the system controller 72 so as to supply the generated print control signal (ejection data) to the head driver 84. Prescribed signal processing is carried out in the droplet ejection control unit 80, and the ejection amount and the ejection timing of the liquid from the recording head 24 are controlled through the head driver 84, on the basis of the ejection data. By this means, prescribed dot size and dot positions can be achieved.

The droplet ejection control unit 80 is provided with the buffer memory 82; and droplet ejection data, parameters, and other data are temporarily stored in the buffer memory 82 when the droplet ejection data is processed in the print controller 80. The aspect shown in FIG. 4 is one in which the buffer memory 82 accompanies the droplet ejection control unit 80; however, the memory 74 can also serve as the buffer memory 82. Also possible is an aspect in which the droplet ejection control unit 80 and the system controller 72 are integrated to form a single processor.

The head driver 84 generates drive signals for driving the piezoelectric elements 58 (see FIG. 3) in the recording head 24, on the basis of ejection data supplied from the droplet ejection controller 80, and supplies the generated drive signals to the piezoelectric elements 58. The head driver 84 can also incorporate a feedback control system for maintaining uniform drive conditions in the recording head 24.

By means of this composition, when the substrate 20 is conveyed to the resist application unit 12, droplets of the resist liquid (resist solution) are ejected toward the substrate 20 from the nozzles 51 in the recording head 24, and thereby the resist liquid is applied on the substrate 20. Thereupon, when the substrate 20 to which the resist liquid has been applied is conveyed to the pattern transfer unit 14, the stamper 26 is pressed against the resist liquid on the substrate 20, UV light is then irradiated to the resist liquid from the UV irradiation device 28, and thereby the resist on the substrate 20 is cured. Then, the stamper 26 is separated from the resist on the substrate 20. Thus, the prescribed fine pattern is transferred to the resist on the substrate 20.

In the pattern transfer apparatus 10 according to the present embodiment, when applying the resist liquid onto the substrate 20 in the resist application unit 12, the resist liquid is applied in such a manner that the shape of each of the droplets of the resist liquid after the droplets ejected from the nozzles 51 in the recording head 24 have landed on the substrate 20 (more specifically, the shape of each droplet upon assuming a stable state after landing on the substrate 20) does not become a circular shape, and the droplets do not combine with other adjacently positioned droplets on the substrate 20.

Figure 5:
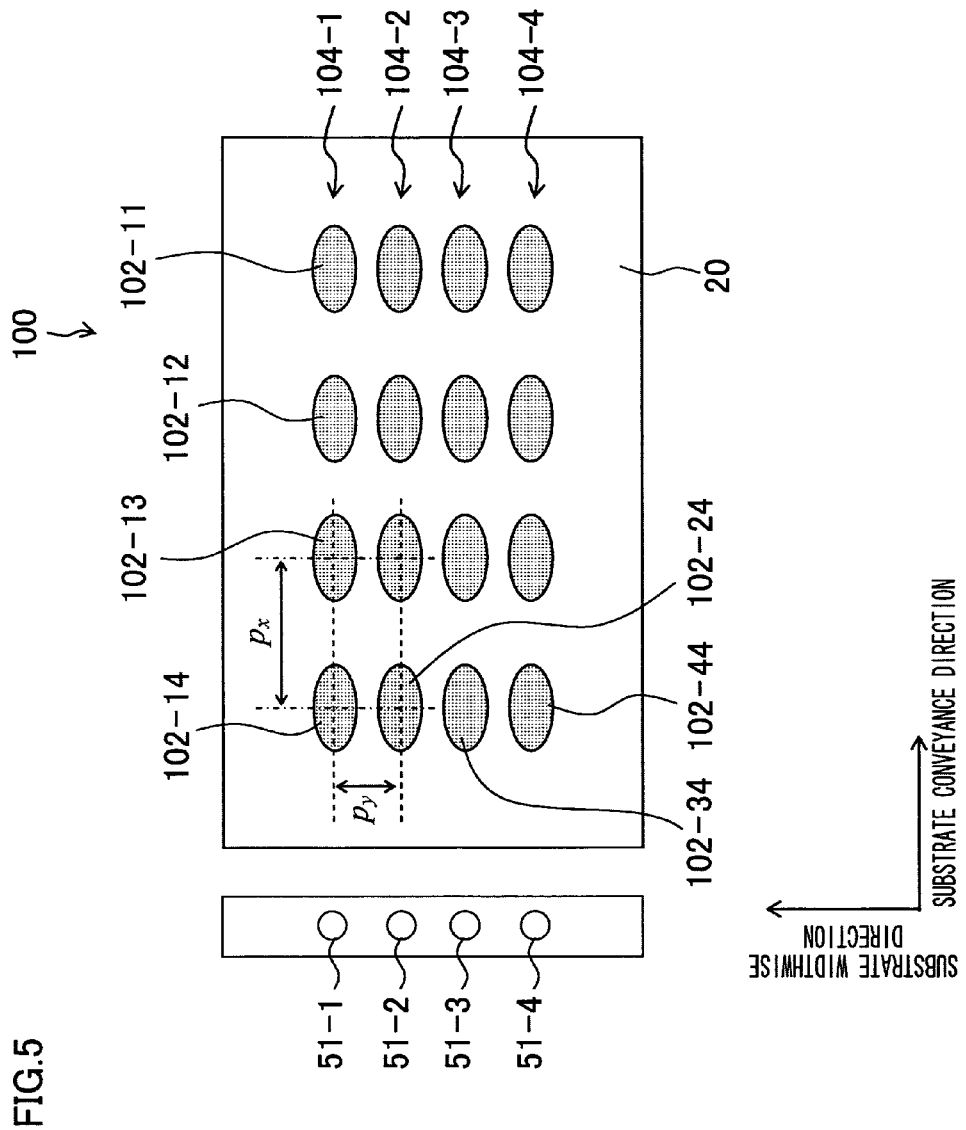
FIG. 5 is a diagram showing a resist pattern in the first embodiment.

FIG. 5 is a diagram showing an example of a resist pattern disposed on the substrate 20 in the pattern transfer apparatus 10 according to the present embodiment. Here, the droplets (dots) which constitute the resist pattern 100 shown in FIG. 5 have been ejected from the four nozzles 51-1, 51-2, 51-3 and 51-4 shown on the left-hand side in the drawing. For example, the first dot row 104-1 constituted of the droplets 102-11, 102-12, 102-13 and 102-14 which are aligned in the uppermost row in FIG. 5 is formed by the droplets ejected from the nozzle 51-1, and similarly, the second dot row 104-2 including the droplet 102-24, the third dot row 104-3 including the droplet 102-34, and the fourth dot row 104-4 including the droplet 102-44, are formed by the droplets ejected from the second to fourth nozzles 51-2, 51-3 and 51-4, respectively.

In the resist pattern 100 shown in FIG. 5, each of the droplets which have been ejected from the nozzles 51-1 to 51-4 and have landed on the substrate 20 has an elliptical shape having the major axis in the substrate conveyance direction (sub-scanning direction), and any of the droplets does not combine with others adjacent respectively in the substrate conveyance direction and the substrate widthwise direction (main scanning direction) perpendicular thereto.

By applying the resist liquid in this way, it is possible to increase the surface area over which the resist liquid wets and spreads on the substrate 20, compared to a case where the resist liquid is applied in such a manner that droplets of the resist liquid immediately after landing have a single circular shape. Moreover, it is possible to achieve uniform distribution of the resist on the substrate 20 since no movement of the resist liquid occurs due to combination of the droplets with other droplets on the substrate 20. Thus, it is possible to prevent non-uniformity in the thickness of the resist film produced by imprinting, while shortening the imprinting time.

Conditions for achieving the resist pattern 100 shown in FIG. 5 are described below.

Figure 6A:
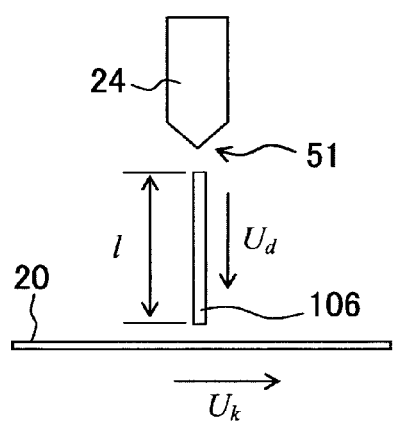
FIG. 6A is a schematic drawing showing a state before a droplet ejected from a nozzle lands on a substrate.
Figure 6B:
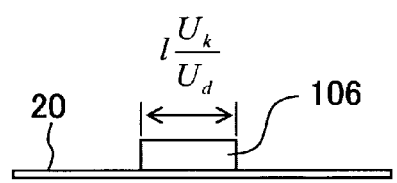
FIG. 6B is a schematic drawing showing a state after the droplet ejected from the nozzle lands on the substrate.

FIG. 6A is a schematic drawing showing a state before a droplet 106 ejected from the nozzle 51 of the recording head 24 has landed on the substrate 20, and FIG. 6B is a schematic drawing showing a state after the droplet 106 has landed on the substrate 20.

In the present embodiment, the substantially column-shaped droplet 106 is ejected from the nozzle 51 of the recording head 24 as shown in FIG. 6A, where l is the length of the substantially column-shaped droplet 106 before landing on the substrate 20 (i.e., the length of the liquid column), $U_d$ is the ejection speed (the speed of flight) of the droplet 106, and $U_k$ is the relative movement speed between the substrate 20 and the recording head 24. Then, as shown in FIG. 6B, when the droplet 106 has landed on the substrate 20, the dimension of the droplet 106 in the substrate conveyance direction is represented as $l \cdot U_k / U_d$.

Possible methods for ejecting a droplet of the liquid in a substantially column-shaped form and achieving a long length of the droplet as described above are raising the viscosity of the liquid, imparting dilatancy to the liquid, reducing the dynamic surface tension of the liquid, or making the ejection speed upon ejection of the droplet very fast indeed (imparting an extremely large amount of energy to the actuator for performing ejection). Dilatancy is the property of the liquid whereby the viscosity of the liquid increases with increase in the shear rate. Dynamic surface tension means the surface tension of the liquid in a flowing or agitated state where the interface is instable.

Figure 7A:
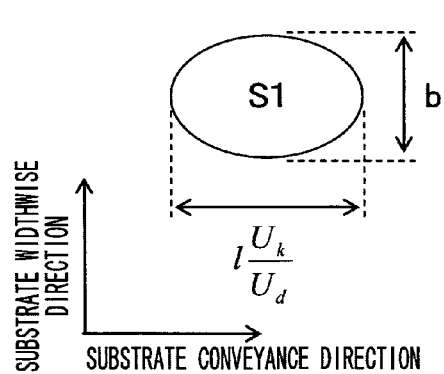
FIG. 7A is an illustrative diagram showing the shape of a droplet before landing.
Figure 7B:
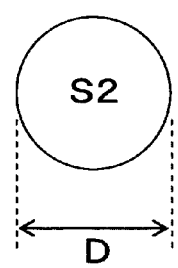
FIG. 7B is an illustrative diagram showing the shape of a droplet after landing.

When a droplet ejected in a substantially columnar shape from the nozzle 51 of the recording head 24 lands on the substrate 20, due to the relative movement of the recording head 24 and the substrate 20, the droplet deposited on the substrate 20 assumes an elliptical shape having the major axis in the substrate conveyance direction (sub-scanning direction) as shown in FIG. 7A, rather than forming a circular shape as shown in FIG. 7B. By depositing the droplets while maintaining the substantially columnar shape, it is possible to reduce the height of the droplets immediately after landing, compared to when droplets of the same volume in a spherical shape are deposited, and the time required for droplets to wet and spread completely is shortened and the resist application time can be shortened.

Desirably, when the droplets are deposited while maintaining the substantially columnar shape, the receding contact angle between the substrate 20 and the resist liquid (resist solution) is no more than 10 degrees. In this case, even if the shape of the droplets immediately after landing is a non-circular shape, it is possible to maintain the state upon landing, without change in the shape of the droplets, even if time has passed after landing. In other words, the elliptical shape of the droplets is maintained until imprinting (pattern transfer) is performed.

In order that the shape of the droplets immediately after landing is the elliptical shape when the droplets are deposited while maintaining the substantially column-shaped form, it is desirable to satisfy the following Formula (10):

[Math. 10]

$$l \frac{U_k}{U_d} > 2 \sqrt[3]{\frac{3V(1+\cos\theta)\sin\theta}{\pi(1-\cos\theta)(2+\cos\theta)}}, \quad (10)$$

where V is the volume of the droplet, l is the length of the droplet (i.e., the length of the liquid column), $U_d$ is the ejection speed (the speed of flight) of the droplet, $U_k$ is the relative movement speed between the substrate 20 and the recording head 24, and θ is the angle of contact between the droplet and the substrate 20.

The left-hand part of Formula (10) indicates the length in the substrate conveyance direction (sub-scanning direction) of the droplet immediately after landing. The right-hand part of Formula (10) indicates the diameter D of the droplet, supposing that the droplet were to have wetted and spread to a circular shape on the substrate 20. If the length in the substrate conveyance direction of the droplet immediately after landing is larger than the diameter D of the droplet after wetting and spreading to the circular shape, then the droplet wets and spreads without assuming the circular shape. Thus, it is possible to shorten the time required until the droplet wets and spreads completely, and the resist application time can be shortened.

Furthermore, in order that the droplet which has been ejected and has landed on the substrate 20 as described above does not combine with other droplets which are adjacent respectively in the substrate conveyance direction and the substrate widthwise direction perpendicular thereto, before imprinting is carried out, it is desirable to satisfy the following Formulae (11) and (12):

[Math. 11]

$$l \frac{U_k}{U_d} < p_x; \text{ and} \quad (11)$$

[Math. 12]

$$\frac{4U_d}{lU_k} \left\{ \frac{3V(1+\cos\theta)\sin\theta}{\pi(1-\cos\theta)(2+\cos\theta)} \right\}^{\frac{2}{3}} < p_y, \quad (12)$$

where $p_x$ is the dot pitch in the substrate conveyance direction, and $p_y$ is the dot pitch in the substrate widthwise direction (see FIG. 5).

Formula (12) is derived as described below. As shown in FIG. 7A, the surface area S1 of the elliptical droplet having the major axis in the substrate conveyance direction is $\pi b \cdot lU_k/U_d/4$, where $lU_k/U_d$ is the dimension of the elliptical droplet in the substrate conveyance direction (the major axis direction) and b is the dimension of the elliptical droplet in the substrate widthwise direction (the minor axis direction). On the other hand, as shown in FIG. 7B, the surface area S2 when a droplet having the same volume has wet and spread to the circular shape on the substrate 20 is $\pi \cdot D^2/4$. If these surface areas are the same (i.e., S1=S2), then $b=D^2 \cdot U_d/lU_k$. Therefore, by satisfying $b<p_y$, in other words, by satisfying Formula (12), the droplet does not combine with other droplets which are adjacent in the substrate widthwise direction.

The receding contact angle between the substrate 20 and the liquid (resist solution) is desirably as small as possible within a range by which the dot pitches $p_x$ and $p_y$ satisfy Formulae (11) and (12).

In order to achieve more uniform application of the resist, it is desirable that the longitudinal/lateral ratio of the deposition dimensions of the droplet and the longitudinal/lateral ratio of the dot pitch are substantially equal to each other, and more desirably the same. That is, it is desirable that the resist is applied so as to satisfy the following Formula (13):

[Math. 13]

$$l \frac{U_k}{U_d} : \frac{4U_d}{lU_k} \left\{ \frac{3V(1+\cos\theta)\sin\theta}{\pi(1-\cos\theta)(2+\cos\theta)} \right\}^{\frac{2}{3}} \cong p_x : p_y. \quad (13)$$

By applying the resist to the substrate 20 in accordance with the conditions described above, it is possible to achieve the resist pattern 100 shown in FIG. 5.

In the pattern transfer apparatus 10 according to the first embodiment, when applying the resist onto the substrate 20 in the resist application unit 12, the resist is applied in such a manner that the form of the droplets of the resist liquid after the droplets ejected from the nozzles 51 of the recording head 24 have landed on the substrate 20 is an elliptical shape having the major axis in the substrate conveyance direction, and the droplets do not combine with other adjacently positioned droplets on the substrate 20. Thereby, it is possible to shorten the wetting and spreading time of the droplets which have landed on the substrate 20, compared to a case where the resist is applied in such a manner that the droplet shape immediately after landing is a circular shape, and moreover, since movement of the resist liquid due to combination of the droplets on the substrate 20 is prevented, then there is no occurrence of bias in the distribution of the resist on the substrate 20. Hence, it is possible to prevent non-uniformity in the thickness of the resist film produced by imprinting, while shortening the imprinting time.

Second Embodiment

The second embodiment of the present invention is described below. Portions which are common with the first embodiment are not explained further, and the following description centers on the characteristic features of the second embodiment.

In the second embodiment, when droplets are ejected from the nozzles 51 of the recording head 24, one or more satellite droplets are generated in addition to the main droplet by each ejection operation. More specifically, when one ejection drive pulse signal is applied to the piezoelectric element 58, at least one satellite droplet is generated in addition to the main droplet, from the corresponding nozzle 51. Here, the main droplet is the droplet that is produced first in one ejection operation and the satellite droplet is the droplet that is produced after the main droplet.

Figure 8:
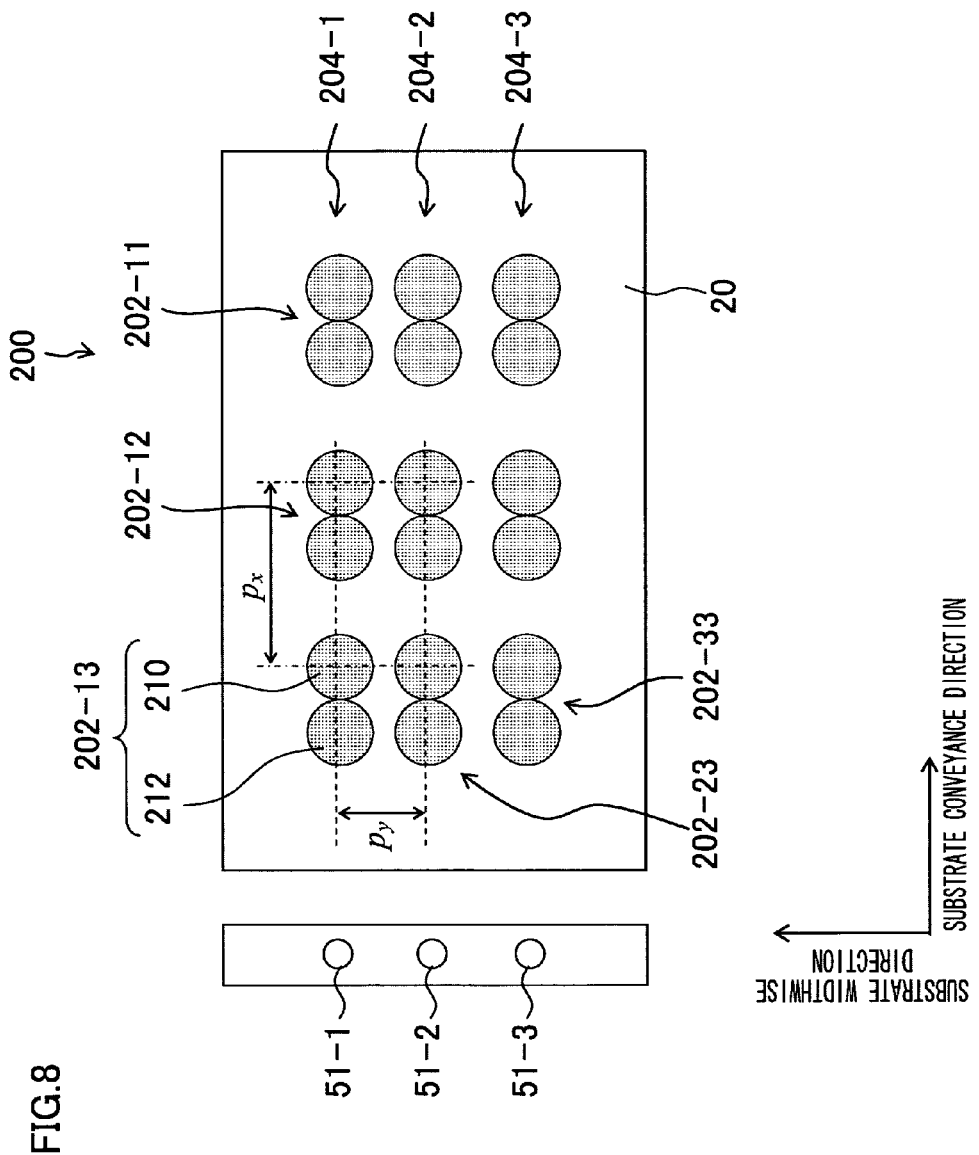
FIG. 8 is a diagram showing a resist pattern in a second embodiment of the present invention.

FIG. 8 is a diagram showing an example of a resist pattern disposed on the substrate 20 in the pattern transfer apparatus 10 according to the second embodiment. Here, the droplets (dots) which constitute the resist pattern 200 shown in FIG. 8 are constituted of pairs of the main droplets 210 and the satellite droplets 212, and are ejected from the three nozzles 51-1, 51-2 and 51-3 shown on the left-hand side in the drawing. For example, the first dot row 204-1 constituted of the pairs of droplets 202-11, 202-12 and 202-13 which are aligned in the uppermost row in FIG. 8 is formed by the droplets ejected from the nozzle 51-1, and similarly, the second dot row 204-2 including the pair of droplets 202-23, and the third dot row 204-3 including the pair of droplets 202-33, are formed by the droplets ejected from the second and third nozzles 51-2 and 51-3, respectively. Although the main droplets 210 and the satellite droplets 212 are depicted with the same size in FIG. 8 for the sake of convenience, their sizes can be different and the main droplets 210 can be bigger than the satellite droplets 212, or vice versa.

In the resist pattern 200 shown in FIG. 8, the main droplet 210 and the satellite droplet 212 produced by one ejection operation from the same nozzle 51 are situated in an alignment in the substrate conveyance direction without combining together, and do not combine with other pairs of droplets which are adjacent respectively in the substrate conveyance direction and the substrate widthwise direction which is perpendicular thereto. Even if the main droplet 210 and the satellite droplet 212 combine together, it is sufficient that they should not form a single circular shape; for example, the main droplet 210 and the satellite droplet 212 can combine and form an elliptical shape having the major axis in the substrate conveyance direction as in the first embodiment.

According to the resist pattern 200, it is possible to reduce the height of the droplets immediately after landing, compared to when droplets of the same volume in a spherical shape are deposited, and the time required for droplets to wet and spread completely is shortened and the resist application time can be shortened.

It is sufficient that the main droplet 210 and the satellite droplet 212 which constitute one pair of droplets should be deposited in different positions on the substrate 20, and the main droplet 210 and the satellite droplet 212 can partially overlap with each other or can be deposited in completely separated positions.

Conditions for achieving the resist pattern 200 shown in FIG. 8 are described below.

Possible methods for generating at least one satellite droplet in addition to a main droplet, with each single ejection operation from the nozzle 51 of the recording head 24, are to raise the ejection speed when ejecting the droplet from the nozzle 51 or to raise the viscosity of the liquid.

In order to deposit a main droplet and a satellite droplet produced by performing one ejection operation from the nozzle 51 (in other words, at one ejection timing) so as to avoid forming a single circular shape on the substrate 20, it is desirable to satisfy the following Formula (14):

[Math. 14]

$$2l\frac{U_k}{U_s} > 2\sqrt[3]{\frac{3V(1+\cos\theta)\sin\theta}{\pi(1-\cos\theta)(2+\cos\theta)}}, \quad (14)$$

where V is the total volume of the droplets (main droplet and satellite droplet) ejected from the nozzle 51 in one ejection operation, l is the distance between the main droplet and the satellite droplet upon landing of the main droplet, $U_s$ is the ejection speed (the speed of flight) of the satellite droplet, $U_k$ is the conveyance speed of the substrate 20, and θ is the angle of contact between the droplet and the substrate 20.

Figure 9:
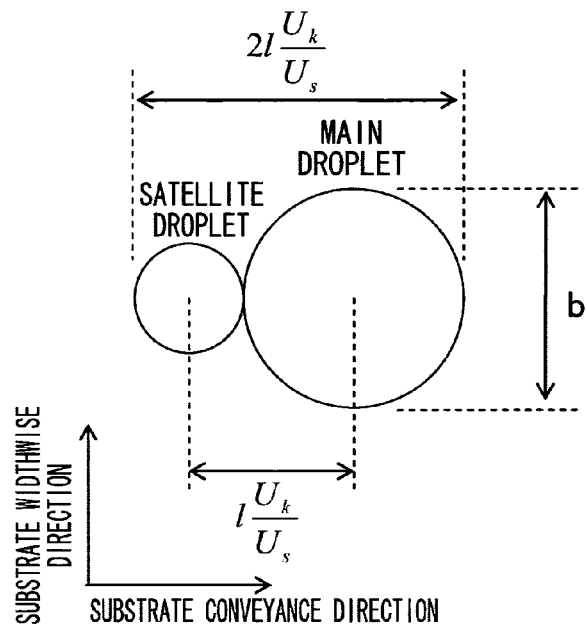
FIG. 9 is an illustrative diagram showing the shape of droplets immediately after landing.

The left-hand part of Formula (14) indicates the total length in the substrate conveyance direction of the main droplet and the satellite droplet immediately after landing, as shown in FIG. 9. The right-hand part of Formula (14) indicates the diameter D of one droplet, supposing that the main droplet and the satellite droplet produced from the same nozzle 51 at the same ejection timing were to have combined together and formed the one droplet, and the one droplet were to have wetted and spread to a circular shape on the substrate 20 (see FIG. 7B). If the total length in the substrate conveyance direction of the main droplet and the satellite droplet immediately after landing is larger than the diameter D of the droplet after wetting and spreading to the circular shape, then the droplets wet and spread without assuming the circular shape. Thus, it is possible to shorten the time required until the droplets wet and spread completely, and the resist application time can be shortened.

Desirably, the receding contact angle between the substrate 20 and the resist liquid (resist solution) is no more than 10 degrees. In this case, even if the shape of the droplets (main droplet and satellite droplet) immediately after landing is prevented from becoming a single circular shape, it is still possible to maintain the state of the droplets upon landing, without change in that shape, even when time has passed after landing.

Furthermore, in order that the pair of droplets (main droplet and satellite droplet) which have been ejected and landed on the substrate 20 as stated above is prevented from combining with other pairs of droplets which are mutually adjacent respectively in the substrate conveyance direction and the substrate widthwise direction perpendicular thereto (i.e., other droplets ejected from the same nozzle at a different ejection timing or other droplets ejected from different nozzles), before imprinting is carried out, it is desirable to satisfy the following Formulae (15), (16) and (17):

[Math. 15]

$$2l\frac{U_k}{U_s} < p_x; \quad (15)$$

[Math. 16]

$$\frac{2U_s}{lU_k}\left\{\frac{3V(1+\cos\theta)\sin\theta}{\pi(1-\cos\theta)(2+\cos\theta)}\right\}^{\frac{2}{3}} < p_y; \text{ and} \quad (16)$$

[Math. 17]

$$2\sqrt[3]{\frac{3V_l(1+\cos\theta)\sin\theta}{\pi(1-\cos\theta)(2+\cos\theta)}} < p_y, \quad (17)$$

where $p_x$ is the dot pitch in the substrate conveyance direction, $p_y$ is the dot pitch in the substrate widthwise direction, and $V_l$ is the volume of the larger of the main droplet and the satellite droplet.

Figure 10A:
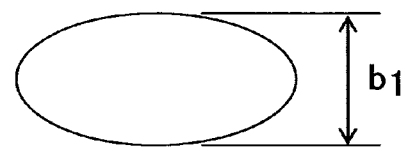
FIG. 10A is an illustrative diagram showing the shape of combined droplets immediately after landing.

The left-hand part in Formula (16) indicates the dimension $b_1$ of an elliptical droplet in the substrate widthwise direction in a case where the main droplet and the satellite droplet combine together and form the elliptical droplet having the major axis in the substrate conveyance direction, as shown in FIG. 10A. As a method for calculating $b_1$, the surface area S1 of the elliptical droplet formed of the main droplet and the satellite droplet combining together is $\pi b_1 \cdot 2/U_k/U_s/4$, where $2/U_k/U_s$ is the dimension of the elliptical droplet in the substrate conveyance direction (the major axis direction). On the other hand, the surface area S2 when a droplet having the same volume with the elliptical droplet has wet and spread to a circular shape on the substrate 20 is $\pi \cdot D^2/4$ (see FIG. 7B). If these surface areas are the same (i.e., S1=S2), then $b_1 = D^2 \cdot U_d/2lU_k$. Therefore, by satisfying $b_1 < p_y$, in other words, by satisfying Formula (16), the elliptical droplet does not combine with other droplets which are adjacent in the substrate widthwise direction.

Figure 10B:
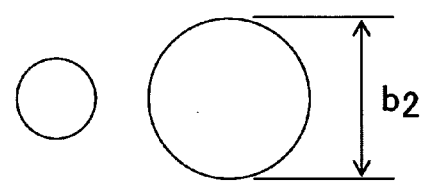
FIG. 10B is an illustrative diagram showing the shape of droplets immediately after landing.

Furthermore, the left-hand part of Formula (17) indicates the dimension $b_2$ of the larger of the main droplet and the satellite droplet in the substrate conveyance direction when the main droplet and the satellite droplet do not combine together, as shown in FIG. 10B (the dimension $b_2$ is equivalent to the droplet diameter of whichever of the main droplet and the satellite droplet has the larger volume).

Consequently, by making the dot pitch $p_y$ in the substrate widthwise direction larger than $b_1$ and $b_2$, the pair of droplets does not combine with other pairs of droplets (main droplets and satellite droplets) which are adjacent in the substrate widthwise direction.

Figure 10C:
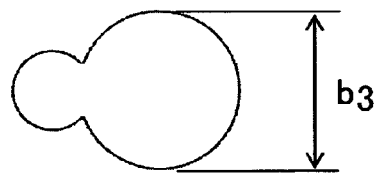
FIG. 10C is an illustrative diagram showing the shape of combined droplets immediately after landing.

There are also cases where, although the main droplet and the satellite droplet combine together, they are still separated by a distance and form a shape such as that shown in FIG. 10C, but since the dimension $b_3$ in the substrate conveyance direction in this case is smaller than $b_2$, it is sufficient if at least the condition in Formula (17) is satisfied.

The receding contact angle between the substrate 20 and the liquid (resist solution) is desirably as small as possible within a range by which the dot pitches $p_x$ and $p_y$ satisfy Formulae (15), (16) and (17).

In order to achieve more uniform application of the resist, it is desirable that the longitudinal/lateral ratio of the deposition dimensions of the droplet and the longitudinal/lateral ratio of the dot pitch are substantially equal to each other, and more desirably the same. That is, it is desirable that the resist is applied so as to satisfy the following Formula (18) or (19):

[Math. 18]

$$l \frac{U_k}{U_s} : \frac{2U_s}{lU_k} \left\{ \frac{3V(1+\cos\theta)\sin\theta}{\pi(1-\cos\theta)(2+\cos\theta)} \right\}^{\frac{2}{3}} \cong p_x : p_y; \text{ or} \quad (18)$$

[Math. 19]

$$l \frac{U_k}{U_s} : 2\sqrt[3]{\frac{3V_l(1+\cos\theta)\sin\theta}{\pi(1-\cos\theta)(2+\cos\theta)}} \cong p_x : p_y. \quad (19)$$

Formula (18) is applied if the following Formula (20) is satisfied, and Formula (19) is applied if Formula (20) is not satisfied:

[Math. 20]

$$\frac{2U_s}{lU_k} \left\{ \frac{3V(1+\cos\theta)\sin\theta}{\pi(1-\cos\theta)(2+\cos\theta)} \right\}^{\frac{2}{3}} > 2\sqrt[3]{\frac{3V_l(1+\cos\theta)\sin\theta}{\pi(1-\cos\theta)(2+\cos\theta)}}. \quad (20)$$

By applying the resist to the substrate 20 in accordance with the conditions described above, it is possible to achieve the resist pattern 200 shown in FIG. 8.

In the pattern transfer apparatus 10 according to the second embodiment, when applying the resist onto the substrate 20 in the resist application unit 12, at least one satellite droplet is produced in addition to the main droplet by each ejection operation from each nozzle 51 of the recording head 24. Then, the resist is applied in such a manner that the main droplet and the satellite droplet which are produced at the same ejection timing from the same nozzle 51 do not form a single circular shape (for example, the main droplet and the satellite droplet do not combine together and are situated in adjacent positions in the substrate conveyance direction), and do not combine with other droplets which are adjacent in the substrate conveyance direction or the substrate widthwise direction perpendicular thereto (i.e., other main droplets and satellite droplets ejected from the same nozzle at a different ejection timing, or other main droplets and satellite droplets ejected from different nozzles). Thereby, it is possible to shorten the wetting and spreading time of the droplets (main droplets and satellite droplets) which have landed on the substrate 20, compared to a case where the resist is applied in such a manner that a main droplet and a satellite droplet produced from the same nozzle at the same ejection timing form a single circular shape immediately after landing, and moreover, since movement of the resist liquid due to combination of mutually adjacent droplets on the substrate 20 is prevented, then there is no occurrence of bias in the distribution of the resist on the substrate 20. Hence, it is possible to prevent non-uniformity in the thickness of the resist film produced by imprinting, while shortening the imprinting time.

Third Embodiment

The third embodiment of the present invention is described below. Portions which are common with the first embodiment are not explained further, and the following description centers on the characteristic features of the second embodiment. The third embodiment is described as an adaptation based on the first embodiment, but can also be applied similarly to the second embodiment.

In the third embodiment, the mode of pressing the stamper 26 against the surface of the substrate 20 to which the resist has been applied differs from the first embodiment.

Figure 11:
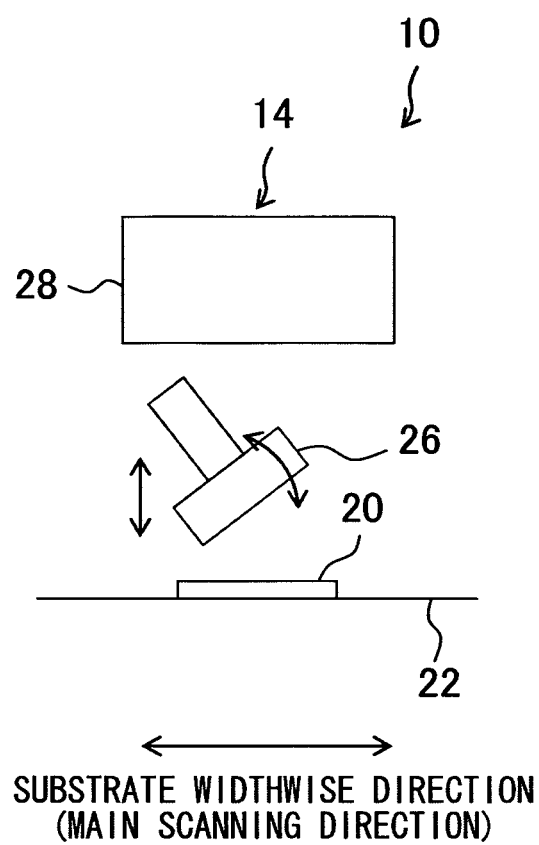
FIG. 11 is an approximate schematic drawing showing a pattern transfer apparatus to a third embodiment of the present invention.
Figure 12:
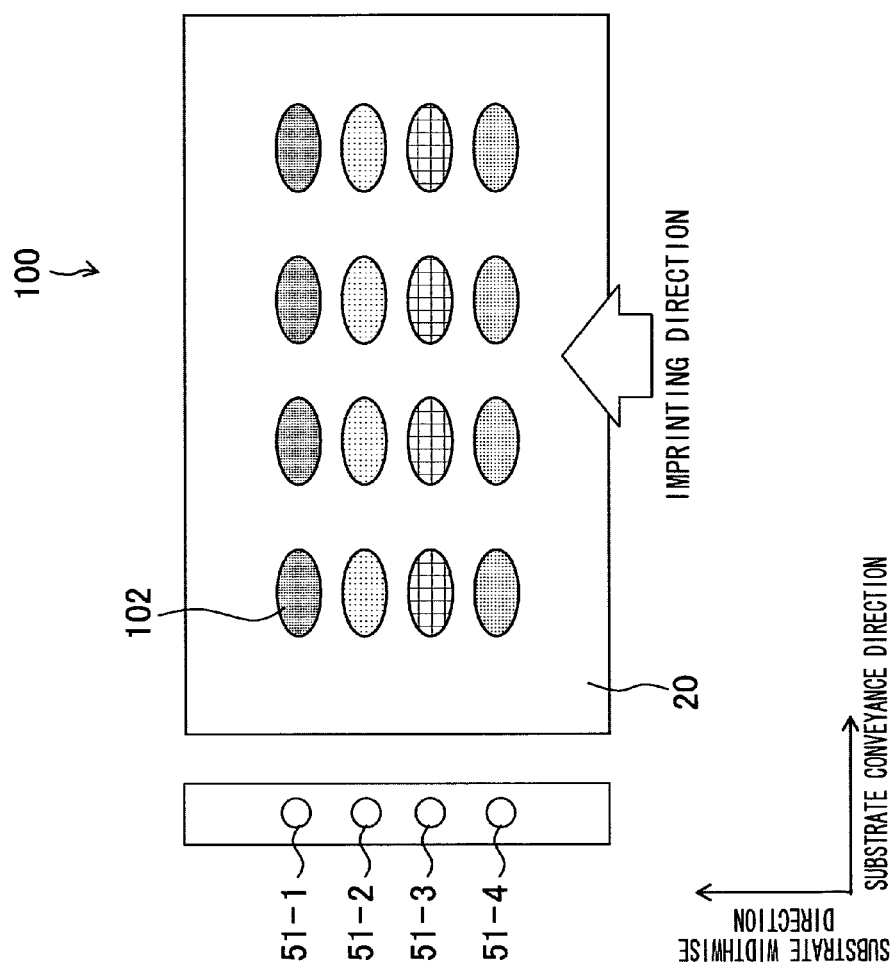
FIG. 12 is a diagram showing an imprinting direction in the third embodiment.

FIG. 11 is a general schematic drawing showing a pattern transfer apparatus according to the third embodiment, and depicts a composition of a pattern transfer unit as viewed in the substrate conveyance direction. As shown in FIG. 11, the pattern transfer apparatus 10 according to the third embodiment is composed in such a manner that, when a pattern is transferred to the resist on the substrate 20 in the pattern transfer unit 14, the pattern forming surface of the stamper 26 is pressed gradually against the surface of the substrate 20 from one end in the substrate widthwise direction (the left-hand side in FIG. 11) toward the other end portion (the right-hand side in FIG. 11), while the stamper 26 is rotated about the substrate conveyance direction (the direction perpendicular to the plane of the drawing in FIG. 11). Thereby, as shown in FIG. 12, the direction in which the stamper 26 is gradually pressed against the resist (hereinafter referred to as the "imprinting direction") is different to the direction (substrate conveyance direction) in which the droplets (dots) ejected from the same nozzle 51 are arranged.

According to the third embodiment, it is possible to prevent effectively film thickness non-uniformity in the resist caused by ejection variations in the nozzles 51, compared to a case where the stamper 26 is pressed gradually against the resist in the same direction as the direction in which the droplets 102 ejected from the same nozzle 51 are aligned (the substrate conveyance direction). Furthermore, by pressing the stamper 26 against the resist gradually as in the present embodiment, air bubbles are prevented from entering into the recess sections formed in the pattern forming surface of the stamper 26 and by this improvement in the resist filling properties, it is possible to improve the accuracy of pattern transfer.

Figure 13:
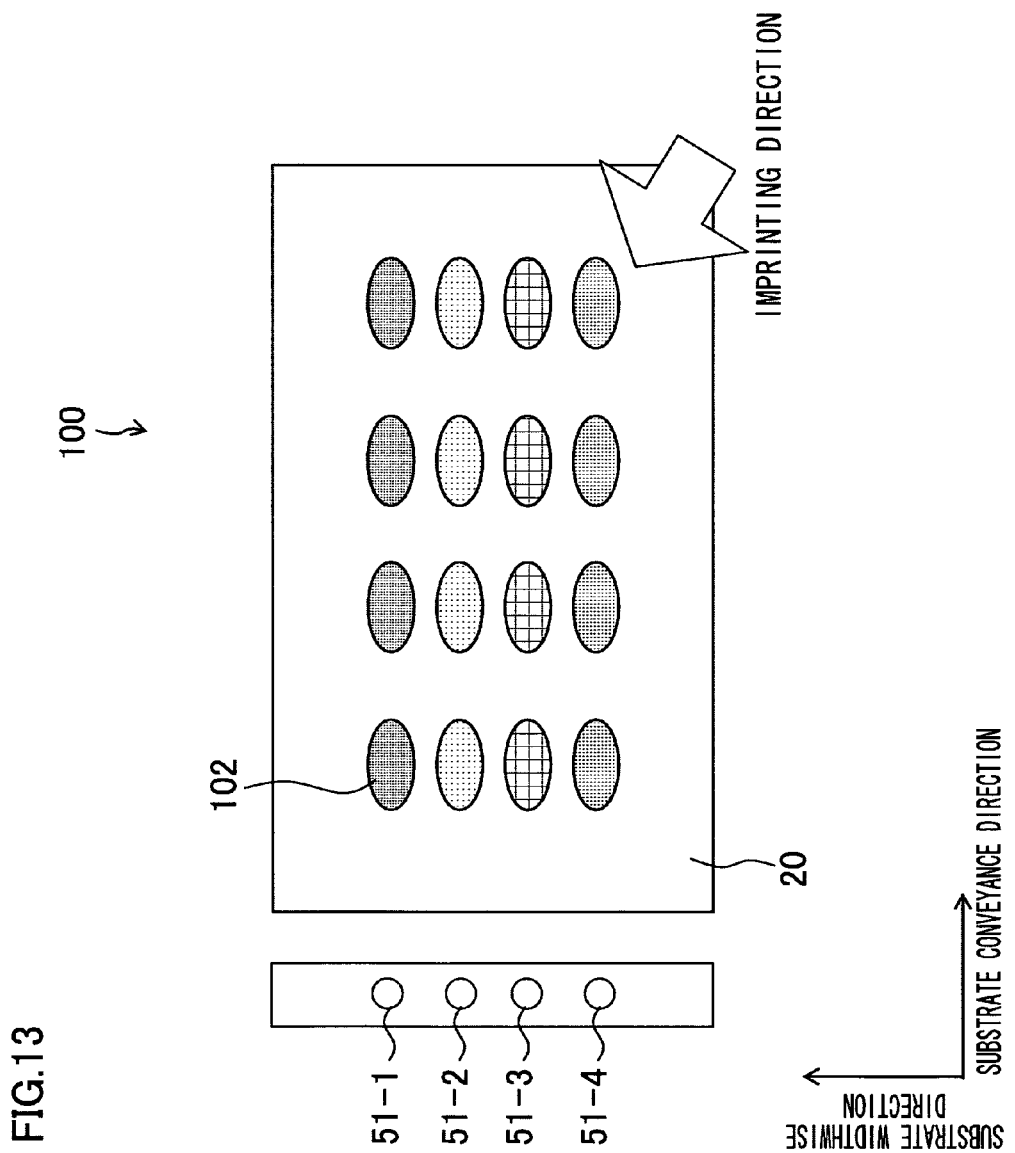
FIG. 13 is a diagram showing another imprinting direction in the third embodiment.

The imprinting direction is the same with the substrate widthwise direction in the above description; however, the present embodiment is not limited to this, and it is sufficient that the imprinting direction should at least be different from the direction in which the droplets (dots) 102 ejected from the same nozzle 51 are aligned. For example, as shown in FIG. 13, the stamper 26 can be pressed against the resist gradually in an oblique direction with respect to the substrate conveyance direction. From the viewpoint of more effectively preventing film thickness non-uniformities in the resist produced as a result of ejection variations between the nozzles 51, a more desirable mode is one where the imprinting direction is a direction perpendicular to the direction in which the droplets 102 ejected from the same nozzle 51 are aligned, as in the embodiment shown in FIG. 12.

Figure 14A:
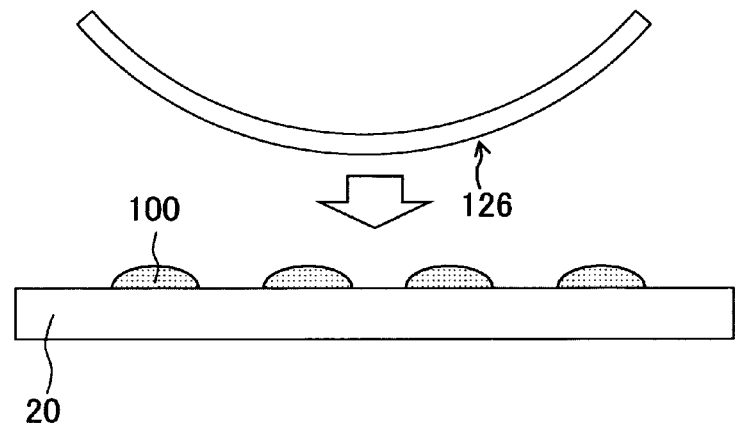
FIG. 14A is an illustrative diagram showing a modification of the third embodiment.
Figure 14B:
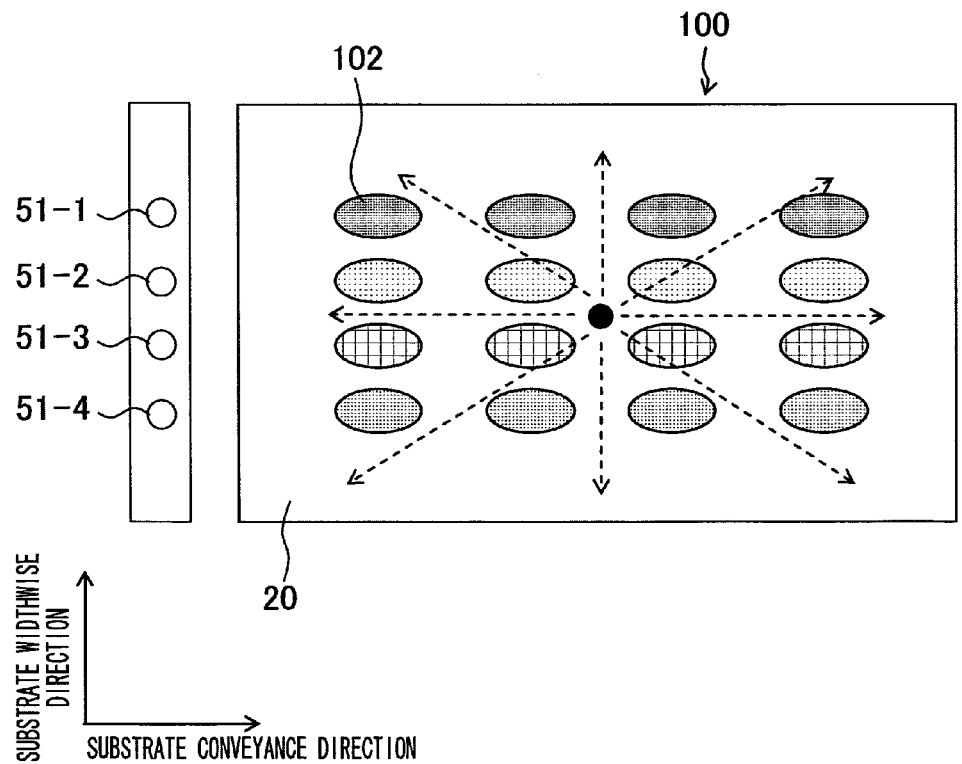
FIG. 14B is an illustrative diagram showing the modification of the third embodiment.

FIGS. 14A and 14B are illustrative diagrams showing a modification of the third embodiment. FIG. 14A is a side view diagram showing an aspect where pattern transfer is being performed, and FIG. 14B is a plan diagram of same. As shown in FIGS. 14A and 14B, when transferring a pattern to the resist on the substrate 20, a stamper in a bent state can be pressed against the surface of the substrate 20 whereby the central portion of the pattern forming surface 126 of the stamper assumes a projection shape on the lower side (the side facing the substrate 20), and the pattern forming surface 126 of the stamper is brought gradually into contact with the substrate 20 in a radiating fashion from the central portion toward the perimeter parts thereof, as indicated with the dotted lines in FIG. 14B. In this case, the imprinting directions (excluding the directions parallel to the substrate conveyance direction from the central portion of the substrate 20) are different to the direction in which the droplets (dots) 102 ejected from the same nozzle 51 are aligned (the substrate conveyance direction), and it is possible to prevent effectively film thickness non-uniformities in the resist produced by ejection variations between the nozzles 51.

The pattern transfer method and pattern transfer apparatus according to the embodiments of the present invention can be used suitably in manufacturing processes such as those described below.

A first technological application is a case where the molded shape (pattern) itself is functional and can be applied to a nano-technology component or structural member. Possible examples include micro-nano-optical elements of various types, and structural members of a high-density recording medium, an optical film and a flat panel display. A second technological application is a case where a laminated structure is built by simultaneously molding a micro-structure and a nano-structure in a single body, or by simple positioning between layers, and this is then applied to the manufacture of a μ-TAS (Micro-Total Analysis System) or a biochip. A third technological application is a case where the formed pattern is used as a mask in an application for processing a substrate by an etching method, or the like. Due to the high-precision positioning and increased levels of integration achieved, this technology can be applied in the place of conventional lithographic techniques to the manufacture of high-density integrated semiconductor circuits, the manufacture of transistors on liquid crystal displays, and the processing of magnetic bodies such as next-generation hard disks which are known as "patterned media".

Moreover, the pattern transfer method and pattern transfer apparatus according to the embodiments of the present invention can be also applied to the formation of optical components for a micro-electrical mechanical system (MEMS), sensor element, diffraction grating, relief hologram, and the like, the formation of optical films for the manufacture of a nano device, optical device, and flat panel display, and the formation of permanent films for a polarizing element, thin film transistor, organic transistor, color filter, overcoat layer, rod member, liquid crystal-orienting rib member, micro lens array, immune assay chip, DNA separation chip, micro-reactor, nano-bio device, light guide, optical filter, photonic liquid crystal, anti-reflective (moth eye) structure, and the like.

The pattern transfer method and pattern transfer apparatus according to the present invention have been described in detail above, but the present invention is not limited to the aforementioned examples, and it is of course possible for improvements or modifications of various kinds to be implemented, within a range which does not deviate from the essence of the present invention.

INDUSTRIAL APPLICABILITY

The present invention can be applied to a pattern transfer method and a pattern transfer apparatus whereby it is possible to prevent film thickness non-uniformities occurring during imprinting while shortening the imprinting time.

REFERENCE SIGNS LIST

10: pattern transfer apparatus; 12: resist application unit; 14: pattern transfer unit; 20: substrate; 22: conveyance unit; 24: recording head; 26: stamper; 28: UV irradiation device; 51: nozzle; 72: system controller

The invention claimed is:
1. A method of performing pattern transfer, the method comprising:
applying liquid to a substrate, while performing relative movement of the substrate and a liquid ejection head having a plurality of nozzles, by performing ejection and deposition of a plurality of droplets of the liquid from the nozzles onto the substrate in a state where a shape of each of the droplets upon the deposition is not a single circular shape and each of the droplets does not combine with adjacent another of the droplets on the substrate; and
curing the liquid that has been applied to the substrate in the applying step while pressing a pattern forming surface of a stamper having a prescribed projection-recess pattern against the liquid,
wherein each of the droplets upon the ejection from the nozzles has a substantially columnar shape and satisfies:

$$l \frac{U_k}{U_d} > 2 \sqrt[3]{\frac{3V(1+\cos\theta)\sin\theta}{\pi(1-\cos\theta)(2+\cos\theta)}},$$

where V is a volume of each of the droplets, l is a length of the substantially columnar shape of each of the droplets, $U_d$ is a speed of each of the droplets upon the ejection, $U_k$ is a speed of the relative movement of the substrate and the liquid ejection head, and θ is an angle of contact between each of the droplets and the substrate.

2. The method as defined in claim 1, wherein the droplets upon the deposition on the substrate satisfy:

$$l\frac{U_k}{U_d} < p_x,$$

where $p_x$ is a pitch of the droplets upon the deposition on the substrate in a direction in which the relative movement of the substrate and the liquid ejection head is performed.

3. The method as defined in claim 1, wherein the droplets upon the deposition on the substrate satisfy:

$$\frac{4U_d}{lU_k}\left\{\frac{3V(1+\cos\theta)\sin\theta}{\pi(1-\cos\theta)(2+\cos\theta)}\right\}^{\frac{2}{3}} < p_y,$$

where $p_y$ is a pitch of the droplets upon the deposition on the substrate in a direction perpendicular to a direction in which the relative movement of the substrate and the liquid ejection head is performed.

4. The method as defined in claim 1, wherein in the curing step, the pattern forming surface of the stamper is pressed against the liquid from one end portion of the pattern forming surface toward another end portion of the pattern forming surface in a first direction that is different from a second direction in which the droplets ejected from a same one of the nozzles are aligned on the substrate.

5. The method as defined in claim 4, wherein the first direction is perpendicular to the second direction.

6. A method of performing pattern transfer, the method comprising:
   applying liquid to a substrate, while performing relative movement of the substrate and a liquid ejection head having a plurality of nozzles, by performing ejection and deposition of a plurality of droplets of the liquid from the nozzles onto the substrate in a state where a shape of each of the droplets upon the deposition is not a single circular shape and each of the droplets does not combine with adjacent another of the droplets on the substrate; and
   curing the liquid that has been applied to the substrate in the applying step while pressing a pattern forming surface of a stamper having a prescribed projection-recess pattern against the liquid,
   wherein while the ejection is performed, at least first and second droplets of the liquid are successively ejected from each of the nozzles by each of ejection operations and satisfy:

$$2l\frac{U_k}{U_s} > 2\sqrt[3]{\frac{3V(1+\cos\theta)\sin\theta}{\pi(1-\cos\theta)(2+\cos\theta)}},$$

where V is a total volume of the first and second droplets, l is a distance between the first and second droplets upon the deposition on the substrate, $U_s$ is a speed of the second droplet upon the ejection, $U_k$ is a speed of the relative movement of the substrate and the liquid ejection head, and θ is an angle of contact between each of the first and second droplets and the substrate.

7. The method as defined in claim 6, wherein the first droplet ejected by a first one of the ejection operations and the first droplet ejected by a second one of the ejection operations successive to the first one of the ejection operations, upon the deposition on the substrate satisfy:

$$2l\frac{U_k}{U_s} < p_x,$$

where $p_x$ is a pitch of the first droplets upon the deposition on the substrate in a direction in which the relative movement of the substrate and the liquid ejection head is performed.

8. The method as defined in claim 6, wherein the first droplet ejected by a first one of the ejection operations and the first droplet ejected by a second one of the ejection operations successive to the first one of the ejection operations, upon the deposition on the substrate satisfy:

$$\frac{2U_s}{lU_k}\left\{\frac{3V(1+\cos\theta)\sin\theta}{\pi(1-\cos\theta)(2+\cos\theta)}\right\}^{\frac{2}{3}} < p_y; \text{ and}$$

$$2\sqrt[3]{\frac{3V_l(1+\cos\theta)\sin\theta}{\pi(1-\cos\theta)(2+\cos\theta)}} < p_y,$$

where $p_y$ is a pitch of the first droplets upon the deposition on the substrate in a direction perpendicular to a direction in which the relative movement of the substrate and the liquid ejection head is performed, and $V_l$ is a volume of a larger of the first and second droplets.

9. The method as defined in claim 6, wherein in the curing step, the pattern forming surface of the stamper is pressed against the liquid from one end portion of the pattern forming surface toward another end portion of the pattern forming surface in a first direction that is different from a second direction in which the droplets ejected from a same one of the nozzles are aligned on the substrate.

10. The method as defined in claim 9, wherein the first direction is perpendicular to the second direction.

11. A pattern transfer apparatus comprising:
   a liquid ejection head which has a plurality of nozzles and performs ejection and deposition of a plurality of droplets of liquid from the nozzles onto a substrate;
   a conveyance device which causes relative movement of the substrate and the liquid ejection head;
   a control device which ensures that a shape of each of the droplets upon the deposition on the substrate is not a single circular shape and each of the droplets does not combine with adjacent another of the droplets on the substrate; and
   a curing device which cures the liquid that has been applied to the substrate by the deposition of the droplets while pressing a pattern forming surface of a stamper having a prescribed projection-recess pattern against the liquid,
   wherein each of the droplets upon the ejection from the nozzles has a substantially columnar shape and satisfies:

$$l\frac{U_k}{U_d} > 2\sqrt[3]{\frac{3V(1+\cos\theta)\sin\theta}{\pi(1-\cos\theta)(2+\cos\theta)}},$$

where V is a volume of each of the droplets, l is a length of the substantially columnar shape of each of the droplets, $U_d$ is a speed of each of the droplets upon the ejection, $U_k$ is a speed of the relative movement of the substrate and the liquid ejection head, and θ is an angle of contact between each of the droplets and the substrate.

12. The pattern transfer apparatus as defined in claim 11, wherein the curing device presses the pattern forming surface of the stamper against the liquid from one end portion of the pattern forming surface toward another end portion of the pattern forming surface in a first direction that is different from a second direction in which the droplets ejected from a same one of the nozzles are aligned on the substrate.

13. The pattern transfer apparatus as defined in claim 12, wherein the first direction is perpendicular to the second direction.

14. The pattern transfer apparatus as defined in claim 11, wherein the droplets upon the deposition on the substrate satisfy:

$$l\frac{U_k}{U_d} < p_x,$$

where $p_x$ is a pitch of the droplets upon the deposition on the substrate in a direction of the relative movement of the substrate and the liquid ejection head.

15. The pattern transfer apparatus as defined in claim 11, wherein the droplets upon the deposition on the substrate satisfy:

$$\frac{4U_d}{lU_k}\left\{\frac{3V(1+\cos\theta)\sin\theta}{\pi(1-\cos\theta)(2+\cos\theta)}\right\}^{\frac{2}{3}} < p_y,$$

where $p_y$ is a pitch of the droplets upon the deposition on the substrate in a direction perpendicular to a direction of the relative movement of the substrate and the liquid ejection head.

16. A pattern transfer apparatus comprising:
a liquid ejection head which has a plurality of nozzles and performs ejection and deposition of a plurality of droplets of liquid from the nozzles onto a substrate;
a conveyance device which causes relative movement of the substrate and the liquid ejection head;
a control device which ensures that a shape of each of the droplets upon the deposition on the substrate is not a single circular shape and each of the droplets does not combine with adjacent another of the droplets on the substrate; and
a curing device which cures the liquid that has been applied to the substrate by the deposition of the droplets while pressing a pattern forming surface of a stamper having a prescribed projection-recess pattern against the liquid,
wherein while the liquid ejection head performs the ejection, at least first and second droplets of the liquid are successively ejected from each of the nozzles by each of ejection operations and satisfy:

$$2l\frac{U_k}{U_s} > 2\sqrt[3]{\frac{3V(1+\cos\theta)\sin\theta}{\pi(1-\cos\theta)(2+\cos\theta)}},$$

where V is a total volume of the first and second droplets, l is a distance between the first and second droplets upon the deposition on the substrate, $U_s$ is a speed of the second droplet upon the ejection, $U_k$ is a speed of the relative movement of the substrate and the liquid ejection head, and θ is an angle of contact between each of the first and second droplets and the substrate.

17. The pattern transfer apparatus as defined in claim 16, wherein the first droplet ejected by a first one of the ejection operations and the first droplet ejected by a second one of the ejection operations successive to the first one of the ejection operations, upon the deposition on the substrate satisfy:

$$2l\frac{U_k}{U_s} < p_x,$$

where $p_x$ is a pitch of the first droplets upon the deposition on the substrate in a direction of the relative movement of the substrate and the liquid ejection head.

18. The pattern transfer apparatus as defined in claim 16, wherein the first droplet ejected by a first one of the ejection operations and the first droplet ejected by a second one of the ejection operations successive to the first one of the ejection operations, upon the deposition on the substrate satisfy:

$$\frac{2U_s}{lU_k}\left\{\frac{3V(1+\cos\theta)\sin\theta}{\pi(1-\cos\theta)(2+\cos\theta)}\right\}^{\frac{2}{3}} < p_y; \text{ and}$$

$$2\sqrt[3]{\frac{3V_l(1+\cos\theta)\sin\theta}{\pi(1-\cos\theta)(2+\cos\theta)}} < p_y,$$

where $p_y$ is a pitch of the first droplets upon the deposition on the substrate in a direction perpendicular to a direction of the relative movement of the substrate and the liquid ejection head, and $V_l$ is a volume of a larger of the first and second droplets.

19. The pattern transfer apparatus as defined in claim 16, wherein the curing device presses the pattern forming surface of the stamper against the liquid from one end portion of the pattern forming surface toward another end portion of the pattern forming surface in a first direction that is different from a second direction in which the droplets ejected from a same one of the nozzles are aligned on the substrate.

20. The pattern transfer apparatus as defined in claim 19, wherein the first direction is perpendicular to the second direction.

* * * * *